US006775178B2

(12) United States Patent
Liu et al.

(10) Patent No.: US 6,775,178 B2
(45) Date of Patent: Aug. 10, 2004

(54) SEU RESISTANT SRAM USING FEEDBACK MOSFET

(75) Inventors: Michael S. Liu, Bloomington, MN (US); Shankar P. Sinha, Redwood City, CA (US)

(73) Assignee: Honeywell International Inc., Morristown, NJ (US)

( * ) Notice: Subject to any disclaimer, the term of this patent is extended or adjusted under 35 U.S.C. 154(b) by 112 days.

(21) Appl. No.: 10/116,296

(22) Filed: Apr. 4, 2002

(65) Prior Publication Data

US 2003/0189847 A1 Oct. 9, 2003

(51) Int. Cl.[7] .............................................. G11C 11/00
(52) U.S. Cl. .................. 365/154; 365/185.07; 365/205; 365/156; 365/190
(58) Field of Search ........................... 365/154, 185.07, 365/205, 156, 190

(56) References Cited

U.S. PATENT DOCUMENTS

| 5,828,597 A | * | 10/1998 | Madan ........................ 365/156 |
| 6,101,116 A | * | 8/2000 | Lien et al. ..................... 365/49 |
| 6,301,148 B1 | * | 10/2001 | Violette ....................... 365/156 |

OTHER PUBLICATIONS

J.P. Colinge et al., "Silicon–on–Insulator "Gate–All–Around" MOS Device", 1990, pp. 137–138.
J.P. Colinge, Silicon–on–Insulator Technology: Materials to VLSI, 1st Edition, Kluwer Academic Publishers (1992), pp. 169–172.

* cited by examiner

Primary Examiner—Connie C. Yoha
(74) Attorney, Agent, or Firm—Schiff Hardin LLP

(57) ABSTRACT

A random access memory cell has first and second inverters each having an input and an output. The input of the first inverter is coupled to the output of the second inverter by a Schottky-diode-free MOSFET. The input of the second inverter is coupled to the output of the first inverter.

25 Claims, 2 Drawing Sheets

SEU RESISTANT SRAM USING FEEDBACK MOSFET

TECHNICAL FIELD OF THE INVENTION

The present invention relates to SRAM memory cells which are resistant to a single event upset (SEU).

BACKGROUND OF THE INVENTION AND PRIOR ART

A memory, such as a static random access memory (SRAM), typically comprises a plurality of memory cells each of which stores a bit of information. A memory cell 10 that is popularly used in an SRAM is shown in FIG. 1. The memory cell 10 is a six transistor cell and includes a first inverter 12 and a second inverter 14. The first inverter 12 includes MOSFETs 16 and 18, and the second inverter 14 includes MOSFETs 20 and 22.

The source terminals of the MOSFETs 16 and 20 are coupled to a source VSS, and the drain terminals of the MOSFETs 18 and 22 are coupled to a reference VDD. The first and second inverters 12 and 14 are cross coupled. Accordingly, the gate terminals of the MOSFETs 16 and 18 are coupled to the drain terminal of the MOSFET 20 and to the source terminal of the MOSFET 22, and the gate terminals of the MOSFETs 20 and 22 are coupled to the drain terminal of the MOSFET 16 and to the source terminal of the MOSFET 18.

A first transmission gate 24 includes a MOSFET having its source/drain circuit coupled to the gate terminals of the MOSFETs 16 and 18 and its gate terminal coupled to a word line WL. Also, a second transmission gate 26 includes a MOSFET having its source/drain circuit coupled to the gate terminals of the MOSFETs 20 and 22 and its gate terminal coupled to the word line WL.

The memory cell 10 is vulnerable to high-energy particles from a radiation harsh environment and hence is prone to losing its programming state upon the occurrences of SEUs over a large range of incident radiation energy and/or charge.

A polysilicon resistor in the inverter cross coupling of the memory cell has been suggested as a solution to this loss of programming state upon the occurrence of a SEU. A memory cell 30 having such a resistor is shown in FIG. 2. The memory cell 30 again is a six transistor cell and includes a first inverter 32 and a second inverter 34. The first inverter 32 includes MOSFETs 36 and 38, and the second inverter 34 includes MOSFETs 40 and 42.

The source terminals of the MOSFETs 36 and 40 are coupled to a source VSS, and the drain terminals of the MOSFETs 38 and 42 are coupled to a reference VDD. The first and second inverters 32 and 34 are cross coupled. Accordingly, the gate terminals of the MOSFETs 36 and 38 are coupled to the drain terminal of the MOSFET 40 and to the source terminal of the MOSFET 42 through a feedback resistor 44, and the gate terminals of the MOSFETs 40 and 42 are coupled directly to the drain terminal of the MOSFET 36 and to the source terminal of the MOSFET 38.

A first transmission gate 46 includes a MOSFET having its source/drain circuit coupled to the gate terminals of the MOSFETs 36 and 38 and its gate terminal coupled to a word line WL. Also, a second transmission gate 48 includes a MOSFET having its source/drain circuit coupled to the gate terminals of the MOSFETs 40 and 42 and its gate terminal coupled to the word line WL.

Unfortunately, the resistance of the feedback resistor 44 changes exponentially with temperature. Hence, at high temperatures (minimum resistivity), the immunity provided by the memory cell 30 to SEUs is low. At low temperatures, the resistivity is high so that the immunity provided by the memory cell 30 to SEU events is also high. However, the high resistance at low temperatures degrades the programming speed of the memory cell 30. Also, the polysilicon that is required to provide sufficient resistance for the feedback resistor 44 uses up too much valuable silicon.

Thus, two back-to-back Schottky diodes coupled in parallel to a seventh transistor has been suggested as an alternative solution to the problem of loss of programming state upon the occurrence of a SEU. A memory cell 50 of this type is shown in FIG. 3. The memory cell 50 is a seven transistor plus Schottky diode cell and includes a first inverter 52 and a second inverter 54. The first inverter 52 includes MOSFETs 56 and 58, and the second inverter 54 includes MOSFETs 60 and 62.

The source terminals of the MOSFETs 56 and 60 are coupled to a source VSS, and the drain terminals of the MOSFETs 58 and 62 are coupled to a reference VDD. The first and second inverters 52 and 54 are cross coupled. Accordingly, the gate terminals of the MOSFETs 56 and 58 are coupled to the drain terminal of the MOSFET 60 and to the source terminal of the MOSFET 62 through the source/drain circuit of a MOSFET 64 and parallel back-to-back Schottky diodes 66, and the gate terminals of the MOSFETs 60 and 62 are coupled directly to the drain terminal of the MOSFET 56 and to the source terminal of the MOSFET 58. The gate terminal of the MOSFET 64 is coupled to a word line WL.

A first transmission gate 68 includes a MOSFET having its source/drain circuit coupled to the gate terminals of the MOSFETs 56 and 58 and its gate terminal coupled to the word line WL. Also, a second transmission gate 70 includes a MOSFET having its source/drain circuit coupled to the gate terminals of the MOSFETs 60 and 62 and its gate terminal coupled to the word line WL.

The back-to-back Schottky diodes 66 provide the feedback resistance needed to resist SEUs. The MOSFET 64 is used only to provide a high conductivity path during write operations but has no use during the standby/programming state.

Unfortunately, control over the manufacturing of the Schottky diodes 66 during fabrication of the memory cell 50 is very poor due to processing complexity. This poor manufacturing control results in a wide variation in feedback resistance and, hence, a wide variation in SEU immunity. Also, for the memory cell 50 to operate properly during normal conditions, the feedback resistance value should be low enough to offer enough conductivity to keep the first and second inverters 52 and 54 cross coupled. The Schottky diodes 66, due to the aforementioned poor manufacturing controls, often have a feedback resistance that is high enough to de-couple the first and second inverters 52 and 54, which results in floating nodes. This floating node problem is even more severe at lower temperatures (such as −55 C) and results in unacceptable standby currents.

The present inventions solves one or more of these and/or other problems.

SUMMARY OF THE INVENTION

In accordance with one aspect of the present invention, a random access memory cell comprises first and second inverters each having an input and an output. The input of the first inverter is coupled to the output of the second inverter by only one device having a junction, and the device comprises a MOSFET. The input of the second inverter is coupled to the output of the first inverter.

In accordance with another aspect of the present invention, a random access memory cell comprises first and second inverters and first and second transmission gates. The first inverter has an input and an output, and the second inverter has an input and an output. The first transmission gate is coupled to the input of the first inverter. The second transmission gate is coupled to the input of the second inverter. The input of the first inverter is coupled to the output of the second inverter by only one active device, and the device comprises a MOSFET. The input of the second inverter is coupled to the output of the first inverter.

In accordance with still another aspect of the present invention, a random access memory cell comprises first, second, third, fourth, fifth, and sixth MOSFETs, and a seventh Schottky-diode-free MOSFET each having a gate, a source, and a drain. The gates of the third and fourth MOSFETs are coupled together, and the gates of the fifth and sixth MOSFETs are coupled together. The sources of the third and fifth MOSFETs are coupled together, and the drains of the fourth and sixth MOSFETs are coupled together. The drain of the third MOSFET is coupled to the source of the fourth MOSFET, and the drain of the fifth MOSFET is coupled to the source of the sixth MOSFET. The gates of the third and fourth MOSFETS are coupled to the drain of the fifth MOSFET and to the source of the sixth MOSFET through the source and drain of the Schottky-diode-free seventh MOSFET. The gates of the fifth and sixth MOSFETs are coupled to the drain of the third MOSFET and to the source of the fourth MOSFET. One of the source and drain of the first MOSFET is coupled to the gates of the third and fourth MOSFETs, and one of the source and drain of the second MOSFET is coupled to the gates of the fifth and sixth MOSFETs. The gates of the first and second MOSFETs are coupled to a write line.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
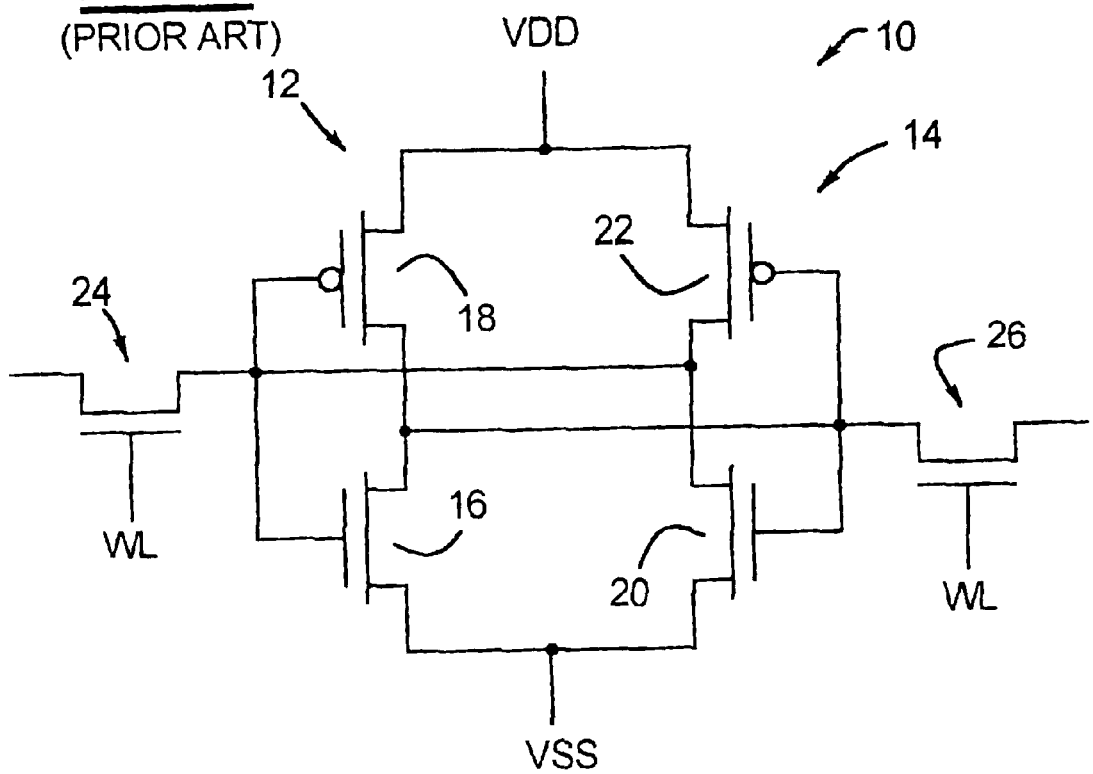
FIG. 1 illustrates a first prior art memory cell.
Figure 2:
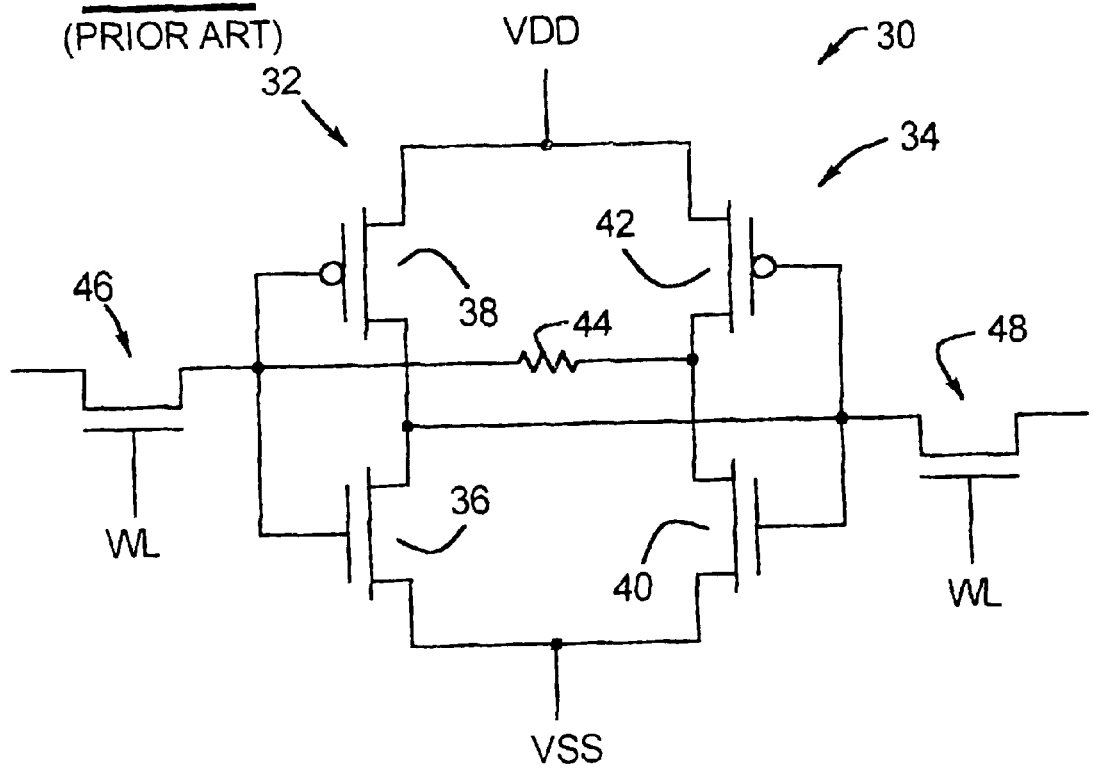
FIG. 2 illustrates a second prior art memory cell.
Figure 3:
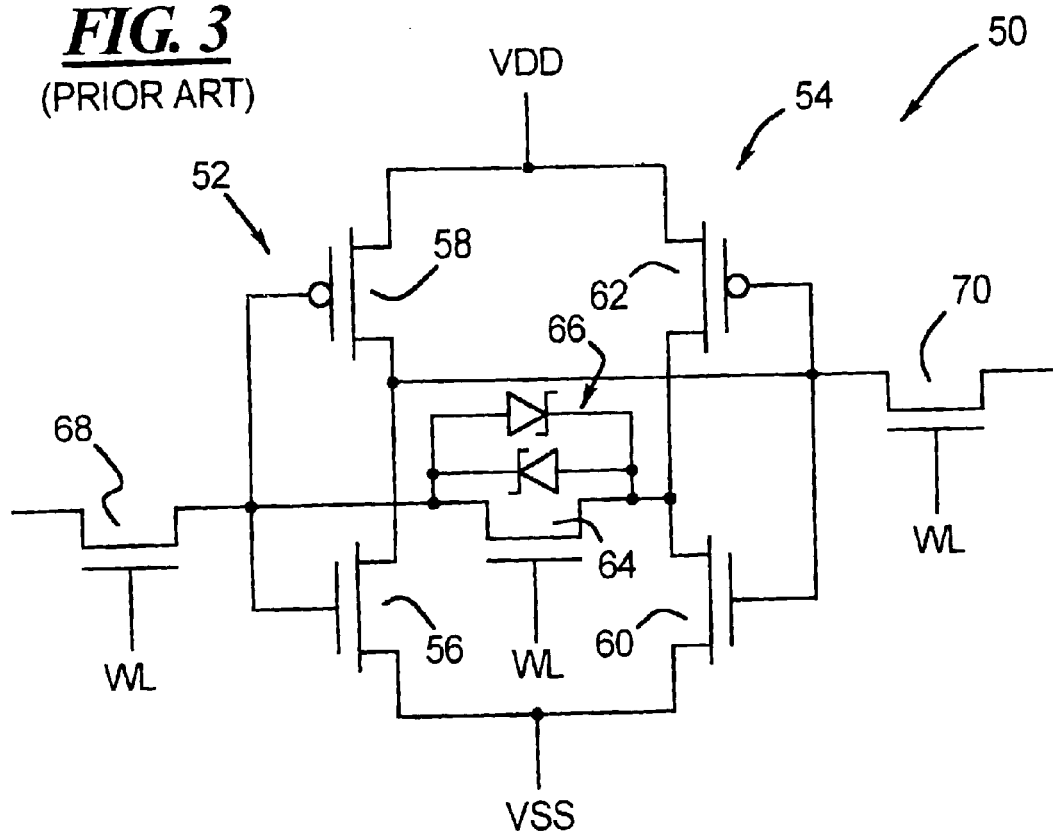
FIG. 3 illustrates a third prior art memory cell.
Figure 4:
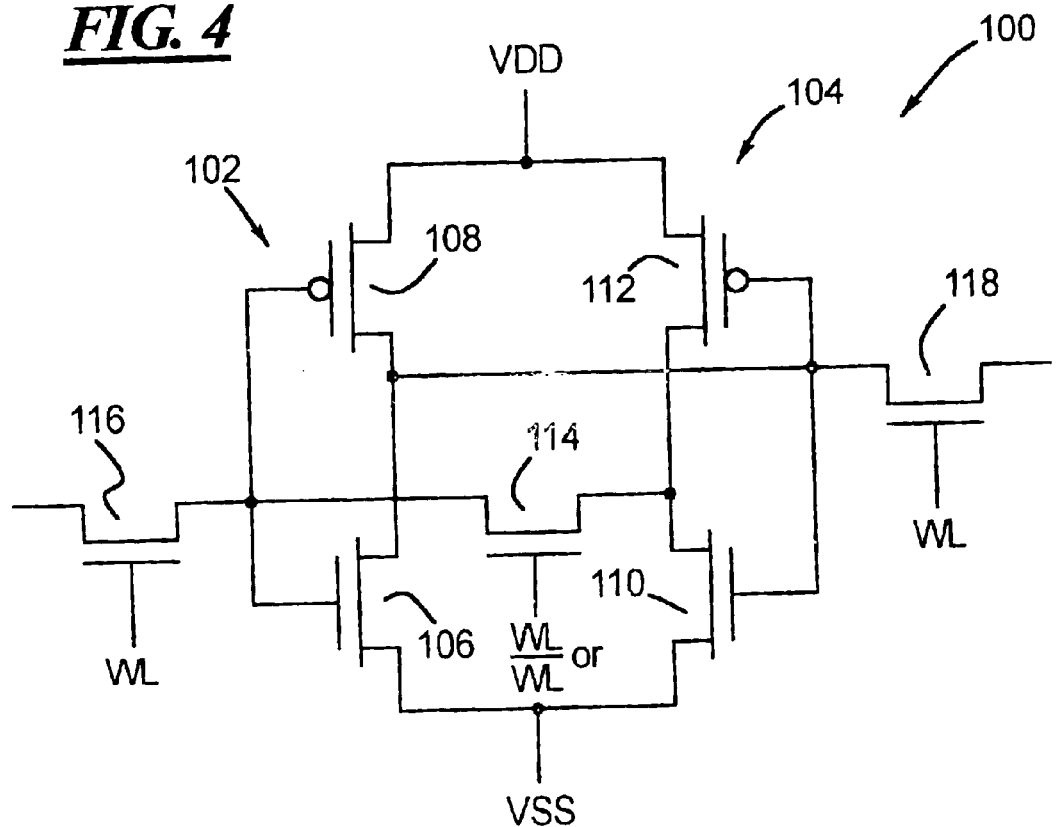
FIG. 4 illustrates a memory cell according to an embodiment of the present invention.

A memory cell 100 according to the present invention is shown in FIG. 3. The memory cell 100 is a seven transistor cell and includes a first inverter 102 and a second inverter 104. The first inverter 102 includes MOSFETs 106 and 108, and the second inverter 104 includes MOSFETs 110 and 112.

The source terminals of the MOSFETs 106 and 110 are coupled to a source VSS, and the drain terminals of the MOSFETs 108 and 112 are coupled to a reference VDD. The first and second inverters 102 and 104 are cross coupled. Accordingly, the gate terminals of the MOSFETs 106 and 108 are coupled to the drain terminal of the MOSFET 110 and to the source terminal of the MOSFET 112 through the source/drain circuit of a MOSFET 114, and the gate terminals of the MOSFETs 110 and 112 are coupled directly to the drain terminal of the MOSFET 106 and to the source terminal of the MOSFET 108. The gate terminal of the MOSFET 114 is coupled to a non-inverted word line or to an inverted word line, as described below.

A first transmission gate 116 includes a MOSFET having its source/drain circuit coupled to the gate terminals of the MOSFETs 106 and 108 and its gate terminal coupled to the word line WL. Also, a second transmission gate 118 includes a MOSFET having its source/drain circuit coupled to the gate terminals of the MOSFETs 110 and 112 and its gate terminal coupled to the word line WL.

The MOSFET 114 may be a depletion mode NMOSFET having a negative threshold voltage and an N+ polysilicon gate. Alternatively, the MOSFET 114 may be an enhancement mode NMOSFET having a positive threshold and an N+ polysilicon gate. A non-inverted word line is coupled to the gate terminal of the MOSFET 114 in the cases where the MOSFET 114 is an NMOSFET. As a further alternative, the MOSFET 114 may be a depletion mode PMOSFET having a negative threshold. As a still further alternative, the MOSFET 114 may be an enhancement mode PMOSFET having a positive threshold and an N+ polysilicon gate. An inverted word line is coupled to the gate terminal of the MOSFET 114 in the cases where the MOSFET 114 is an PMOSFET.

The seventh transistor, i.e., the MOSFET 114, functions as a feedback resistor during SEUs. The threshold voltage of the MOSFET 114 can be adjusted to obtain the required feedback resistance in saturation (depletion mode FETs) or in a sub-threshold regime (enhancement mode FETs). During the standby/programmed mode, the MOSFET 114 operates in a linear regime (depletion mode FETs) or in a sub-threshold regime (enhancement mode FETs), and provides sufficient conductance at all operating temperatures (−55 C to +125 C) in order to cross couple the first and second inverters 102 and 104. During a "write" operation when WL is high, the MOSFET 114 operates in saturation and provides sufficient drive current for programming.

The memory cell 100 is more easily manufactured than the memory cell 50. The variation in the feedback resistance in the memory cell 100 is controlled by the drive current of the MOSFET 114 in saturation or in the sub-threshold region and is very small compared to the variation in resistance of the feedback resistance 44 in the memory cell 30. Also, the temperature sensitivity of the resistance represented by the MOSFET 114 (i.e., the "on" resistance of the MOSFET 114) is much less than that of a polysilicon resistance or a Schottky diode. Finally, during normal operation, sufficient conductivity is provided by the drive current of the MOSFET 114 to avoid floating nodes and/or high standby currents.

Certain modifications of the present invention have been discussed above. Other modifications will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A random access memory cell comprising:
   a first inverter having an input and an output;
   a second inverter having an input and an output;
   wherein the input of the first inverter is coupled to the output of the second inverter by only one device having a junction, and wherein the device comprises a MOSFET; and, wherein the input of the second inverter is coupled to the output of the first inverter.

2. The random access memory cell of claim 1 wherein the MOSFET comprises a depletion mode NMOSFET having a negative threshold and an N+ polysilicon gate.

3. The random access memory cell of claim 1 wherein the MOSFET comprises an enhancement mode NMOSFET having a positive threshold and an N+ polysilicon gate.

4. The random access memory cell of claims 2 or 3 further comprising a non-inverted word line coupled to a gate of the NMOSFET.

5. The random access memory cell of claim 1 wherein the MOSFET comprises a depletion mode PMOSFET having a negative threshold.

6. The random access memory cell of claim 1 wherein the MOSFET comprises an enhancement mode PMOSFET having a positive threshold and an N+ polysilicon gate.

7. The random access memory cell of claims 5 or 6 further comprising an inverted word coupled to a gate of the PMOSFET.

8. The random access memory cell of claim 1 wherein the input of the second inverter is coupled directly to the output of the first inverter.

9. A random access memory cell comprising:
   a first inverter having an input and an output;
   a second inverter having an input and an output;
   a first transmission gate coupled to the input of the first inverter;
   a second transmission gate coupled to the input of the second inverter;
   wherein the input of the first inverter is coupled to the output of the second inverter by only one active device, and wherein the active device comprises a MOSFET; and,
   wherein the input of the second inverter is coupled to the output of the first inverter.

10. The random access memory cell of claim 9 wherein the MOSFET comprises a depletion mode NMOSFET having a negative threshold and an N+ polysilicon gate.

11. The random access memory cell of claim 9 wherein the MOSFET comprises an enhancement mode NMOSFET having a positive threshold and an N+ polysilicon gate.

12. The random access memory cell of claims 10 or 11 further comprising a non-inverted word line coupled to a gate of the NMOSFET and to the first and second transmission gates.

13. The random access memory cell of claim 9 wherein the MOSFET comprises a depletion mode PMOSFET having a negative threshold.

14. The random access memory cell of claim 9 wherein the MOSFET comprises an enhancement mode PMOSFET having a positive threshold and an N+ polysilicon gate.

15. The random access memory cell of claims 13 or 14 further comprising an inverted word coupled to a gate of the PMOSFET and a non-inverted word line coupled to the first and second transmission gates.

16. The random access memory cell of claim 9 wherein the input of the second inverter is coupled directly to the output of the first inverter.

17. A random access memory cell comprising:
   first, second, third, fourth, fifth, and sixth MOSFETs each having a gate, a source, and a drain;
   a Schottky-diode-free seventh MOSFET having a gate, a source, and a drain;
   wherein the gates of the third and fourth MOSFETs are coupled together;
   wherein the gates of the fifth and sixth MOSFETs are coupled together;
   wherein the sources of the third and fifth MOSFETs are coupled together;
   wherein the drains of the fourth and sixth MOSFETs are coupled together;
   wherein the drain of the third MOSFET is coupled to the source of the fourth MOSFET;
   wherein the drain of the fifth MOSFET is coupled to the source of the sixth MOSFET;
   wherein the gates of the third and fourth MOSFETs are coupled to the drain of the fifth MOSFET and to the source of the sixth MOSFET through the source and drain of the Schottky-diode-free seventh MOSFET;
   wherein the gates of the fifth and sixth MOSFETs are coupled to the drain of the third MOSFET and to the source of the fourth MOSFET;
   wherein one of the source and drain of the first MOSFET is coupled to the gates of the third and fourth MOSFETs;
   wherein one of the source and drain of the second MOSFET is coupled to the gates of the fifth and sixth MOSFETs; and,
   wherein the gates of the first and second MOSFETs are coupled to a write line.

18. The random access memory cell of claim 17 wherein the Schottky-diode-free seventh MOSFET comprises a depletion mode NMOSFET having a negative threshold and an N+ polysilicon gate.

19. The random access memory cell of claim 17 wherein the Schottky-diode-free seventh MOSFET comprises an enhancement mode NMOSFET having a positive threshold and an N+ polysilicon gate.

20. The random access memory cell of claims 18 or 19 wherein the write line comprises a non-inverted write line, and wherein the non-inverted write line is coupled to the gate of the NMOSFET.

21. The random access memory cell of claim 17 wherein the Schottky-diode-free seventh MOSFET comprises a depletion mode PMOSFET having a negative threshold.

22. The random access memory cell of claim 17 wherein the Schottky-diode-free seventh MOSFET comprises an enhancement mode PMOSFET having a positive threshold.

23. The random access memory cell of claims 21 or 22 wherein the write line comprises a non-inverted write line, and wherein an inverted write line is coupled to the gate of the PMOSFET.

24. The random access memory cell of claim 17 wherein the gates of the fifth and sixth MOSFETs are coupled directly to the drain of the third MOSFET and to the source of the fourth MOSFET.

25. The random access memory cell of claim 17 wherein the gates of the first and second MOSFETs and of the Schottky-diode-free seventh MOSFET are coupled to the write line.

* * * * *